(12) United States Patent
Shiraishi

(10) Patent No.: US 6,958,948 B2
(45) Date of Patent: Oct. 25, 2005

(54) SEMICONDUCTOR DEVICE HAVING A DATA LATCHING OR STORING FUNCTION

(75) Inventor: Atsushi Shiraishi, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/887,572

(22) Filed: Jul. 8, 2004

(65) Prior Publication Data
US 2005/0036394 A1  Feb. 17, 2005

(30) Foreign Application Priority Data
Jul. 14, 2003  (JP) .............................. 2003-274109

(51) Int. Cl.[7] .............................. G11C 7/00; G11C 8/00
(52) U.S. Cl. .......................... 365/230.05; 365/230.06; 365/189.05
(58) Field of Search ...................... 365/230.05, 230.06, 365/189.05

(56) References Cited
U.S. PATENT DOCUMENTS 5,260,908 A * 11/1993 Ueno .................... 365/230.05
5,375,089 A * 12/1994 Lo ........................ 365/189.05
5,473,574 A * 12/1995 Clemen et al. ......... 365/230.05
5,477,489 A * 12/1995 Wiedmann ............. 365/230.05
5,717,638 A * 2/1998 Kim ...................... 365/189.05
5,828,610 A * 10/1998 Rogers et al. .......... 365/230.06
6,288,969 B1 * 9/2001 Gibbins et al. ........ 365/230.05
6,741,517 B1 * 5/2004 Fisher et al. ........... 365/230.05

* cited by examiner

Primary Examiner—Trong Phan
(74) Attorney, Agent, or Firm—Jacqueline J. Garner; W. James Brady, III; Frederick J. Telecky, Jr.

(57) ABSTRACT

The current consumed by latching data and during standby are significantly decreased in order to realize reduced power consumption. In this memory cell, source voltages $V_{RET}$ and $V_{DD}$ are supplied to latch circuit 10 and output circuit 32 from different systems. Latch circuit 10 can be separated from a peripheral circuit by NMOS transistor 20 and transmission gate 24. MOS transistors 12, 14, 16, and 18, which constitute latch circuit 10 and MOS transistors 20, 26, and 28, which constitute the switch circuit, are configured using low-leakage MOS transistors with leakage current significantly lower than those of standard MOS transistors used to configure the peripheral circuit including output circuit 32.

21 Claims, 4 Drawing Sheets

SEMICONDUCTOR DEVICE HAVING A DATA LATCHING OR STORING FUNCTION

FIELD OF THE INVENTION

The present invention pertains to a semiconductor device having a data latching or storing function. In particular, it pertains to a semiconductor memory device and a semiconductor memory cell capable of latching data continuously while a source voltage is applied.

BACKGROUND OF THE INVENTION

Although a static RAM (Random-Access Memory) has the disadvantage that many elements are needed to configure each memory cell, it has the advantage that it stores data continuously without requiring a refresh operation as long as a source voltage is applied so as to achieve a high-speed writing/reading. In general, in the case of a static RAM, a pair of CMOS (Complementary Metal Oxide Semiconductor) inverters are used to configure each flip-flop circuit. More specifically, two CMOS inverters, each configured by connecting a PMOS (P-channel MOS) transistor and an NMOS (N-channel MOS) transistor in series, are connected in parallel between a source voltage terminal at source voltage $V_{DD}$ and a source voltage at ground potential $V_{SS}$, and the input terminal and the output terminal of each inverter are connected to the output terminal and the input terminal of the other inverter by means of cross-coupling in order to configure a single bistable circuit or a flip-flop circuit with a pair of data storage nodes.

In general, in the case of a memory cell of this type, the pair of data storage nodes are connected to a pair of complementary bit lines via a pair of transfer gate transistors which are turned on and off via word lines. To write data to the memory, both bit lines are driven or precharged to two types of complementary (opposite logic levels) potentials according to the logic value of the data to be written in order to turn on both transfer gate transistors, and voltage signals on the bit lines are input (written) into the respective data storage nodes via the transfer gate transistors. To read stored data from the memory cell, both transfer gate transistors are turned on simultaneously in order to output the voltages of the data storage nodes to the respective bit lines via the transfer gate transistors, and the voltage signal(s) on one or both of the bit lines is/are detected in the form of binary values in order to generate the read data. To keep stored data in the memory, both transfer gate transistors should be kept off. However, source voltage $V_{DD}$ must be applied constantly. If the application of source voltage $V_{DD}$ is stopped, the supply of a data latch current to the data storage node on the side where an H-level voltage is clamped is stopped, and the data stored will be lost.

Furthermore, in the case of a multi-port static RAM, two or more sets of data can be written or read simultaneously in one cycle, and a write and a read can be carried out simultaneously in one cycle.

As described above, because the static RAM configured using the CMOS circuit consumes little current during operation or in stand-by, it is widely used in products and systems such as portable equipment which contains a small number of components. However, in recent CMOS fabrication technology, although the spread of MOS transistors have increased with further miniaturization, the leakage current has increased, exposing the dilemma between increasing speed and reducing power consumption. Nevertheless, in actual products, applications that require high-speed operation and reduced power consumption, for example, the processing of moving pictures on cellular telephones, continue to increase. That is, a power reduction technology capable of handling both the limitation of the CMOS process and requirements of actual products is in demand.

The present invention was conceived in the light of the aforementioned problem, and its purpose is to present a semiconductor device, a semiconductor memory, and a semiconductor memory cell with which the data latching current and the current consumed during standby can be significantly decreased in order to realize decreased power consumption.

SUMMARY OF THE INVENTION

In order to achieve the aforementioned objective, the semiconductor device of the present invention has a latch circuit including at least one MOS transistor for latching one bit of data electrically in the form of voltage and a switch circuit including at least one MOS transistor for connecting and disconnecting the latch circuit to and from a circuit peripheral to the aforementioned latch circuit, wherein, a second source voltage is supplied to the aforementioned latch circuit independently of a first source voltage supplied to the aforementioned peripheral circuit, the aforementioned switch circuit is turned on and off sequentially with the turning on and off of the aforementioned first source voltage to the aforementioned peripheral circuit, and the MOS transistors included in the aforementioned latch circuit and the aforementioned switch circuit are configured using a low-leakage MOS transistor with a lower leakage current than that of the MOS transistor included in the aforementioned peripheral circuit.

An advantage of the invention is providing a semiconductor device with reduced power consumption.

DESCRIPTION OF THE EMBODIMENTS

With the semiconductor device of the present invention, the current consumed in latching data and during the standby can be significantly decreased in order to realize reduced power consumption.

Suitable embodiments of the present invention will be explained below with reference to the attached drawings.

Figure 1:
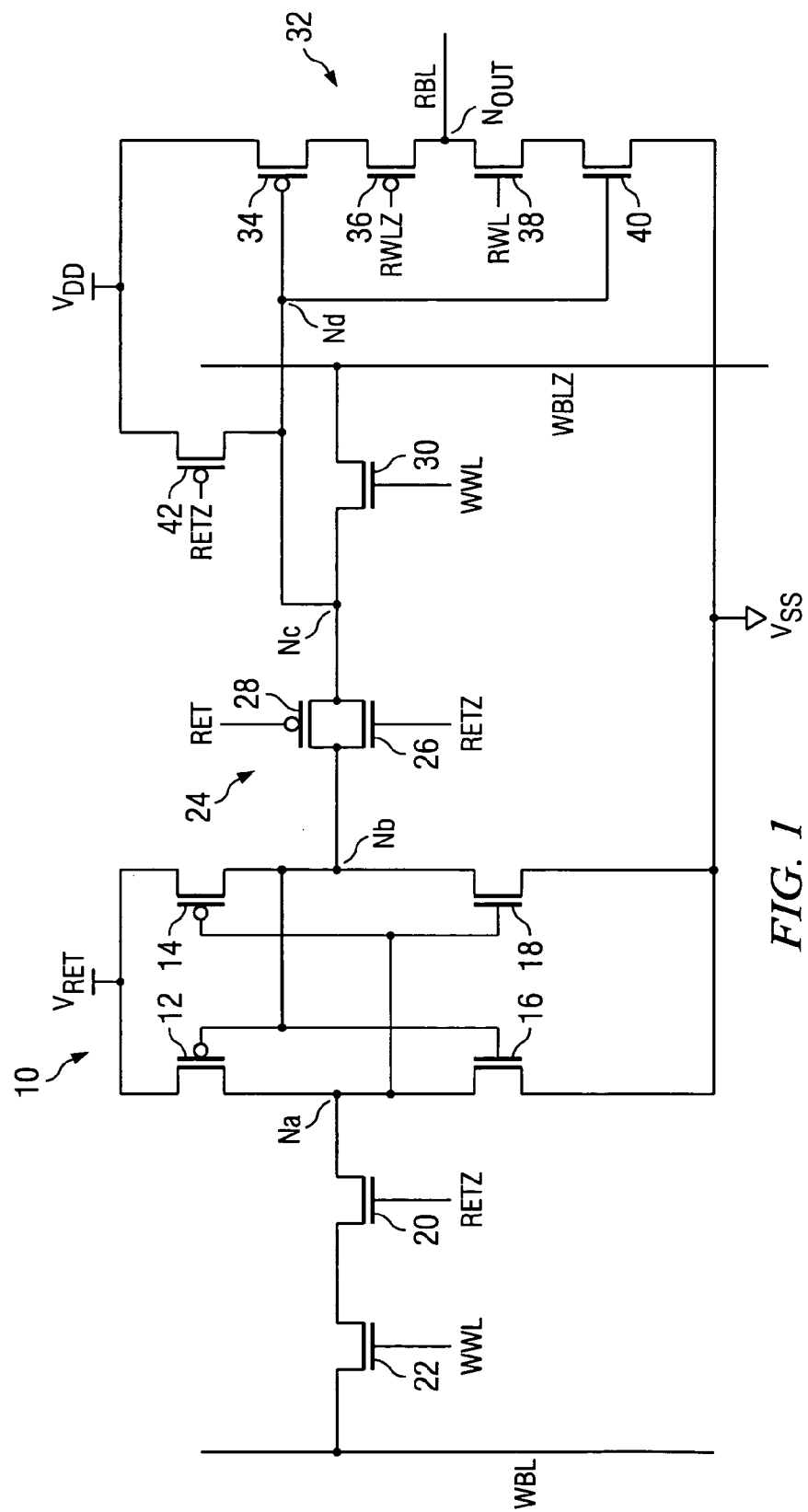
FIG. 1 is a circuit diagram showing the circuit configuration of the memory cell of the static RAM in an embodiment of the present invention.

The circuit configuration of a static RAM in accordance with an embodiment of the present invention is shown in FIG. 1. Said memory is configured as an asynchronous two-port (one write port and one read port) memory cell, and it is connected to one word line WWL and a pair of write bit lines WBL and WBLZ as well as a pair of read word lines RWL and RWLZ and 1-bit read line RBL.

Latch circuit 10 of said memory cell is configured using a pair of CMOS inverters, that is, two PMOS transistors 12 and 14, and two NMOS transistors 16 and 18. More specifically, while the respective power supply terminals of PMOS transistors 12 and 14 are connected to a source voltage terminal at source voltage $V_{RET}$, the respective power supply terminals of NMOS transistors 16 and 18 are connected to reference potential, for example, a source voltage terminal at ground potential $V_{SS}$, the respective drain terminals of PMOS transistor 12 and NMOS transistor 16 are connected to form first data storage node $N_a$, and the respective drain terminals of PMOS transistor 14 and NMOS transistor 18 are connected to form second data storage node $N_b$. Then, first data storage node $N_a$ is connected to the respective gate terminals of PMOS transistor 14 and NMOS transistor 18 on the other side, and second data storage node $N_b$ is connected to the respective gate terminals of PMOS transistor 12 and NMOS transistor 16 on the other side. In short, one of the CMOS inverters is configured using PMOS transistor 12 and NMOS transistor 16, the other CMOS inverter is configured using PMOS transistor 14 and NMOS transistor 18, the input terminals (gate terminals) and the output terminals (nodes) of the respective CMOS transistors are connected to the output terminals (nodes) and the input terminals (gate terminals) of the respective partners by means of cross-coupling, and $V_{RET}$ is applied as a source voltage.

In said latch circuit 10, first data storage node $N_a$ is electrically connected to one of the write bit lines WBL via NMOS transistors 20 and 22, and second data storage node $N_b$ is electrically connected to the other write bit line WBLZ via transmission gate 24 and NMOS transistor 30.

More specifically, NMOS transistor 20 and NMOS transistor 22 are connected in series between first data storage node $N_a$ and one of the write bit lines WBL. Here, NMOS transistor 20 constitutes a latch circuit for surrounding the switch circuit for connecting and disconnecting first data storage node $N_a$ of latch circuit 10 to and from the peripheral circuit, and control signal RETZ from power supply controller part 70 (FIG. 3) (to be described below is supplied to its gate terminal. In addition, NMOS transistor 22 constitutes a write transfer gate, and write word line WWL is connected to its gate terminal.

Transmission gate 24 and NMOS transistor 30 are connected in series between second data storage node $N_b$ and the other write bit line WBLZ. Transmission gate 24 is formed by connecting NMOS transistor 26 and PMOS transistor 28 in parallel and is used to configure a latch circuit for surrounding the switch circuit for connecting and disconnecting second data storage node $N_b$ of latch circuit 10 to and from the peripheral circuit. Control signals RETZ and RET are supplied at complementary logic levels (H level/L level) from power supply controller part 70 (FIG. 3) to the respective gate terminals of NMOS transistor 26 and PMOS transistor 28. In addition, NMOS transistor 30 constitutes a write transfer gate, and write word line WWL is connected at its gate terminal.

This memory cell has output circuit 32 to provide an output port independently of its input port. Said output port 32 is configured as a clock type CMOS transistor comprising two PMOS transistors 34 and 36 and two NMOS transistors 38 and 40 and is designed to operate at source voltage $V_{DD}$ from a different system than source voltage $V_{RET}$ of latch circuit 10. More specifically, CMOS inverter is configured using PMOS transistor 34 and NMOS transistor 40, and PMOS transistor 36 and NMOS transistor 38 are provided as read transfer gates. That is, the power supply terminal of PMOS transistor 34 is connected to the source voltage terminal at source voltage $V_{DD}$, the power supply terminal of NMOS transistor 40 is connected to the source voltage terminal at ground potential $V_{SS}$, the drain terminals of both transistors 34 and 40 are connected to the output node or data output terminal $N_{OUT}$, respectively, via PMOS transistor 36 and NMOS transistor 38, and the gate terminals of both transistors 34 and 30, that is, CMOS inverter input terminal (node $N_d$), are connected to node $N_c$ formed between transmission gate 24 and NMOS transistor 30. Complementary read word lines RWLZ and RWL are connected to the respective gate terminals of PMOS transistor 36 and NMOS transistor 38. Furthermore, data output terminal $N_{OUT}$ is connected to read bit line RBL.

Figure 3:
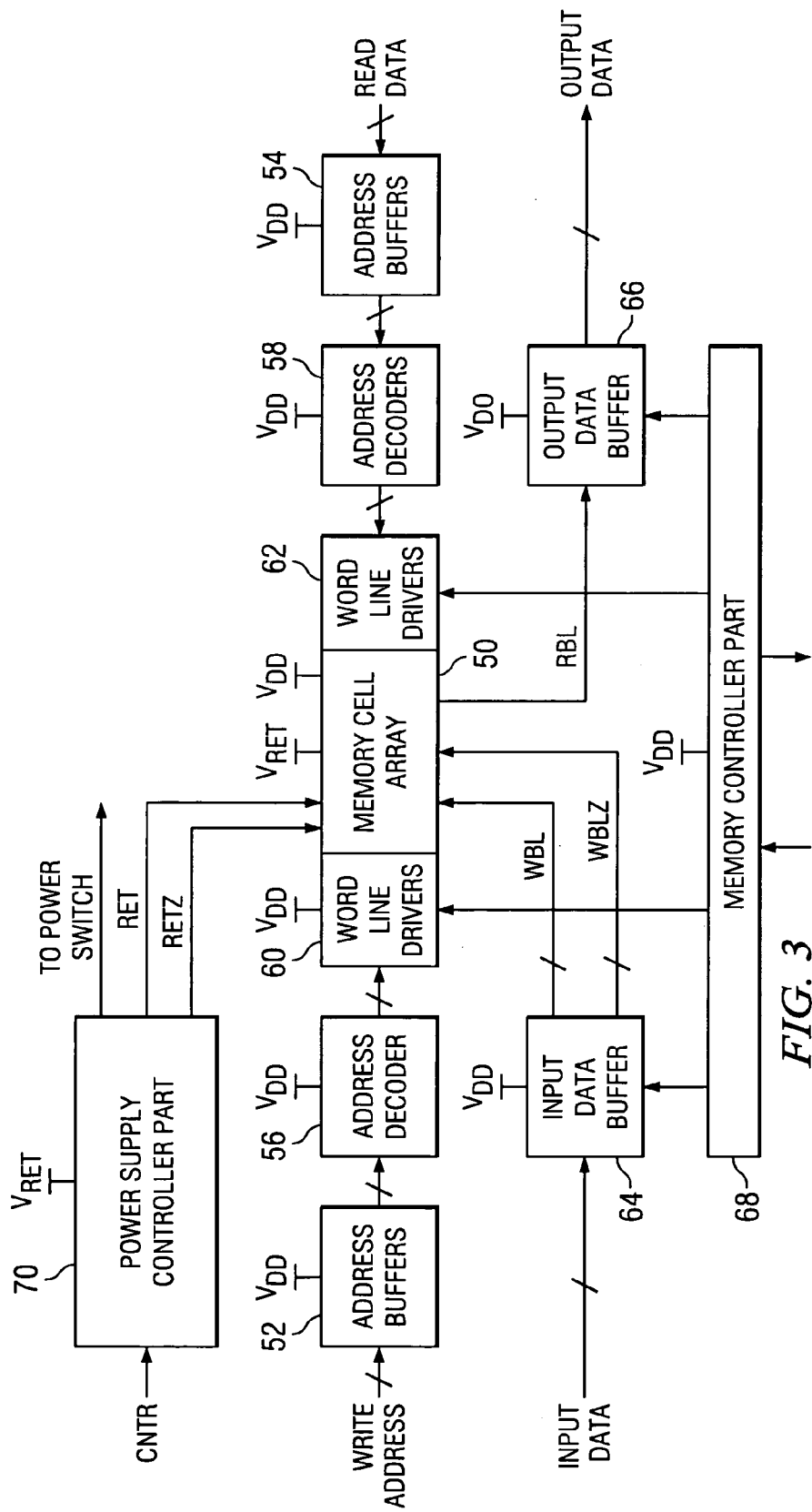
FIG. 3 is a block diagram showing the overall configuration of the static RAM in the embodiment.

PMOS transistor 42 is connected between the source voltage terminal at source voltage $V_{DD}$ and the input terminal of output circuit 10 or aforementioned node $N_d$. As will be described in further detail below, said PMOS transistor 42 is used to prevent node $N_d$ from floating when source voltage $V_{DD}$ is turned off while in standby mode, and control signal RETZ is supplied to its gate terminal from power supply controller part 70 (FIG. 3).

One of the characteristics of said memory cell is that MOS transistors 12, 14, 16, and 18 which constitute latch circuit 10, and MOS transistors 20, 26, and 28, which constitute the switch circuit, are all low-leakage MOS transistors and have significantly lower leakage currents (preferably, 1/10 or lower) than the leakage currents of standard MOS transistors which constitute the peripheral circuit including output circuit 32. For example, it has been confirmed that in the case of a low-leakage MOS transistor in which the thickness of the gate oxide film is twice as thick as that of the standard MOS transistor, the leakage current can be reduced to approximately 1/60 of that of the standard MOS transistor. The difference between the low-leakage MOS transistor and the standard MOS transistor can be set as desired by selecting the MOS fabrication requirements and characteristics.

In general, the low-leakage MOS transistor in such cases will operate at a lower speed than the standard MOS transistor. However, as described above, since a bistable circuit with a positive feedback loop is used in latch circuit 10, there is no substantial speed reduction when it is configured with low-leakage MOS transistors 12, 14, 16, and 18. However, because it is surrounded by the switch circuit comprising low-leakage MOS transistors 20, 26, and 28, the write speed drops somewhat when compared to the prior art. But because a read operation is realized by reading electric charge through output circuit 32 configured with a CMOS inverter, the read performance is almost unaffected.

In the case of said memory cell, as described above, source voltages $V_{RET}$ and $V_{DD}$ are supplied from separate systems to latch circuit 10 and output circuit 32. Source voltage $V_{RET}$ is a memory backup source voltage used mainly for latching and storing data, and it is supplied continuously as long as the main switch to said equipment remains closed. On the other hand, source voltage $V_{DD}$ is the usual operating voltage used for almost all circuit operations other than data latching, and it can be shut off even when the main switch to said equipment is closed. That is, said equipment is configured such that source voltage $V_{DD}$ is supplied while in normal operating mode when a given function is being executed, and source voltage $V_{DD}$ is shut off while in standby mode when the execution of a given function is suspended.

In said memory cell, control signals RETZ and RET from power supply controller part 70 (FIG. 3) are clamped to the H level and L level, respectively, while in the normal mode in order to keep latch circuit surrounding NMOS transistor 20 and transmission gate 24 on and to keep float prevention PMOS transistor 42 off.

To write one bit of data to said memory cell, write bit lines WBL and WBLZ are driven or precharged to complementary logic levels (H level/L level) according to the write data value, write word line WWL is activated to H level, and both transistors 22 and 30 are turned on simultaneously. Then, the voltage signal on one of bit lines WBL is written to first data storage node $N_a$ via transfer gate 22 and NMOS transistor 20, and the voltage signal on the other bit line WBLZ is written to second data storage node $N_b$ via transfer gate 30 and transmission gate 24 at the same time. At this time, the positive feedback loop in latch circuit 10 operates to stabilize the write voltages to data storage nodes $N_a$ and $N_b$ instantaneously. Furthermore, although it is possible to apply H level voltages to both bit lines WBL and WBLZ during a write cycle, in such a case, the contents stored in the memory cell are not changed, and the data that have thus far been latched will be maintained. Application of L level voltage signals to both bit lines WBL and WBLZ is prohibited.

To read one bit of data from said memory cell, read word lines RWLZ and RWL are activated to L level and H level, respectively, at output circuit 32 in order to turn on both transfer gates 36 and 38 simultaneously. At this time, because the potential of node $N_c$ has become approximately equal to the potential of second data node $N_b$ via transmission gate 24, a voltage signal with the opposite logic level to that of the potential of node $N_c$ is sent as output data to read bit line RBL from data output terminal $N_{OUT}$.

Once said equipment switches from normal mode to standby mode, in said memory cell, source voltage $V_{DD}$ to output circuit 32 is shut off, control signals RETZ and RET from power supply controller part 70 (FIG. 3) are changed to L level and H level, respectively, latch circuit for surrounding NMOS transistor 20 and transmission gate 24 are turned off, and floating prevention PMOS transistor 42 is turned on. Neither a read nor a write operation is carried out during standby mode, and all transfer gates 22, 30, 36, and 38 remain off. Source voltage $V_{RET}$ is supplied to latch circuit 10 even during standby mode.

While in said standby mode, latch circuit 10 latches the data using a data latch current significantly lower than those of low-leakage MOS transistors 12, 14, 16, and 18 with applied source voltage $V_{RET}$, exhibiting a stable data latching function at significantly lower power consumption than when it is configured with the standard MOS transistors. Moreover, latch circuit 10 is surrounded by low-leakage MOS transistors 20 (26, 28), and these low-leakage MOS transistors 20 (26, 28) are turned off while in standby mode to separate latch circuit 10 from the peripheral circuit, so that hardly any current leaks from latch circuit 10 to the peripheral circuit. In addition, because source voltage $V_{DD}$ is shut off while in standby mode, no power is consumed by output circuit 32.

Float prevention PMOS transistor 42 is turned on immediately before source voltage $V_{DD}$ is shut off so as to clamp the potential of node $N_d$ (input to output circuit 32) to the level (H level) of source voltage $V_{DD}$ in order to prevent node $N_d$ from floating during the transition until source voltage $V_{DD}$ is completely shut off. That is, if node $N_d$ floats there is the risk that the current which flows through MOS transistors 34, 36, 38, and 40 in output circuit 32 will destroy said transistors. When node $N_d$ is prevented from flowing by using PMOS transistor 42 as a clamp, current in output circuit 32 can be prevented, and the protection of MOS transistors 34, 36, 38, and 40 can be assured.

Figure 2:
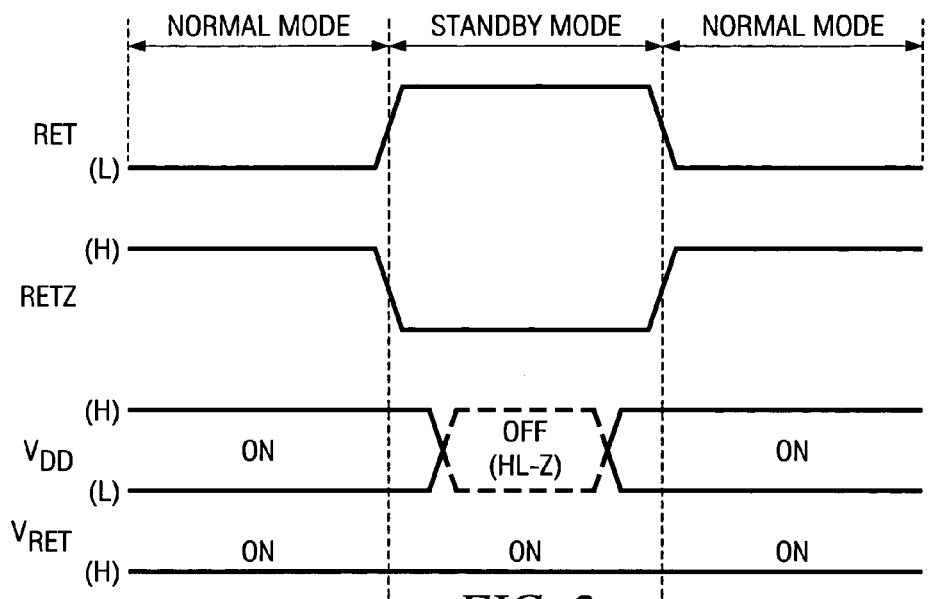
FIG. 2 is a timing diagram showing changes in the conditions of the respective parts when switching between normal mode and standby mode in the embodiment.

An example of changes in the conditions at the respective parts, or the timing, when switching between the normal mode and standby mode is shown in FIG. 2. As shown in said example, it is desirable that control signals RET and RETZ be changed to H level and L level for the standby mode before source voltage $V_{DD}$ is shut off when switching from normal mode to standby mode, and control signal RET and RETZ are returned to L level and H level for the normal mode after stabilization by applying source voltage $V_{DD}$ when returning from standby mode to normal mode.

The overall configuration of the static RAM in the present embodiment is shown in FIG. 3. Said static RAM has memory cell array 50 formed as an integrated circuit on the same semiconductor chip, address buffers 52 and 54, address decoders 56 and 58, word line drivers 60 and 62, data buffers 64 and 66, memory controller part 68, and power supply controller part 70. Memory cell array 50 is configured using the aforementioned memory cell (FIG. 1), wherein memory cells (FIG. 1) equal in number to the number of bits corresponding to the memory length are provided in the array using a prescribed layout.

To gain access to said static RAM for a write operation, a write address signal, write data, and a write control signal are supplied to write address buffer 52, input data buffer 64, and memory controller part 68, respectively, from a related external circuit (not shown) at an arbitrary timing. Write address decoder 56 decodes the input write address signal and supplies a signal for selecting or enabling one of the write word lines WWL in memory cell array 50 to write word line driver 60. Once write word line driver 60 enables said selected word line WWL, write transfer gates 22 and 30 are turned on in the respective memory cells (FIG. 1) connected to said word line WWL in memory cell array 50. Then, data equivalent to one word are transferred to into memory cell array 50 bit by bit via a pair of bit lines WBL and WBLZ from input data buffer 64 and written to said respective memory cells (FIG. 1).

To gain access to said static RAM for a read operation, a read address signal and a read control signal are supplied to read address buffer 54 and memory controller part 68, respectively, from a related external circuit (not shown) at an arbitrary timing. Read address decoder 58 decodes the input read address signal and supplies a signal for selecting or activating a pair of read word lines RWL and RWLZ within memory cell array 50 to read word line driver 62. Once read word line driver 62 activates said pair of selected read word lines RWL and RWLZ, read transfer gates 38 and 36 of output circuit 32 are turned on at the respective memory cells (FIG. 1) connected to said word lines RWL and RWLZ within memory cell array 50. Then, the read data output from data output terminal $N_{OUT}$ of output circuit 32 are sent to output data buffer 66 via read bit line RBL and sent to the related external circuit from output data buffer 66.

In the case of said static RAM, only memory cell array 50 operates at both source voltage $V_{RET}$ for memory backup and source voltage $V_{DD}$ for normal operation; and the other functional circuits 52 through 68, such as address buffers 52 and 54 and data buffers 64 and 66, operated at source voltage $V_{DD}$ for normal operation. Power supply controller part 70 functions at an arbitrary timing regardless of whether the mode is normal mode or standby mode as long as the main power switch is on, and it may operate at a source voltage, such as $V_{RET}$, other than source voltage $V_{DD}$. Therefore, while in normal mode, the power is consumed by all functional blocks 50 through 57 at source voltage $V_{DD}$ or $V_{RET}$. Then, while in standby mode, no power is consumed by functional circuits 52 through 68 of the $V_{DD}$ system at all because source voltage $V_{DD}$ is shut off. In addition, as described above, of the $V_{RET}$-based functional circuits, latch circuits 10 of the respective memory cells in memory cell array 50 in particular are not only configured using low-leakage MOS transistors, but they are also surrounded by switch circuits 20 and 24 comprising low-leakage MOS transistors and separated from peripheral $V_{DD}$ system circuit by said switch circuits 20 and 24 while in standby mode. As a result, the power consumption due to data latching and current leakage is very low, and the power consumption by the entire memory cell array 50 is also very low.

Figure 4:
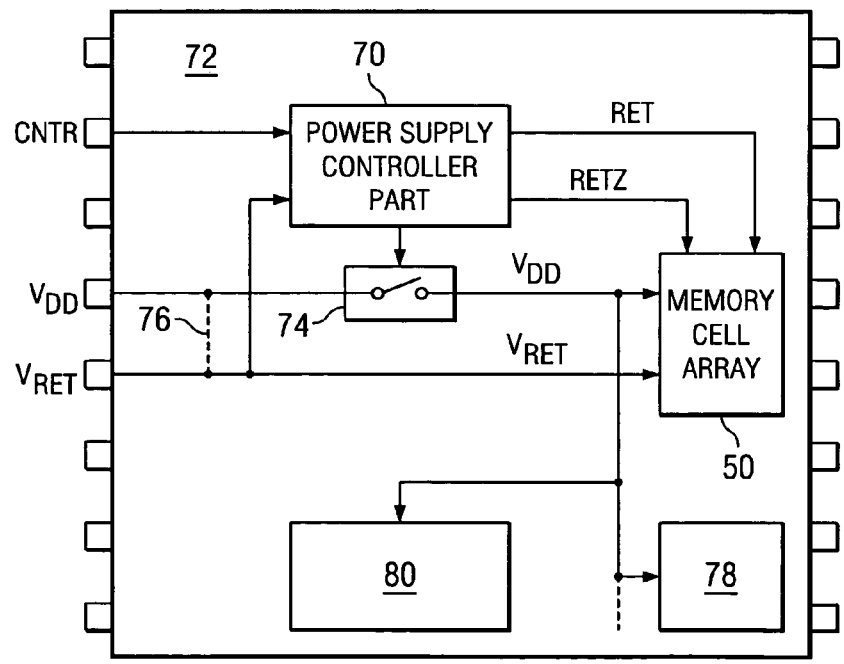
FIG. 4 is a diagram showing the configuration of the power supply system in the embodiment.

Configuration of the source voltage supply system of the present embodiment is shown schematically in FIG. 4. As shown in the figure, source voltages $V_{DD}$ and $V_{RET}$ output from an external power supply circuit (not shown) are lead into respective power supply lines in the chip via a power input terminal or a pad provided on suitable semiconductor chip 72. Power switch 74 is provided at a point on the power line for source voltage $V_{DD}$, and power supply controller part 70 controls the turning on and off of said power switch 74. The power line for source voltage $V_{RET}$ is directly connected to the given parts (memory cell array 50, in particular) sourced. Furthermore, when source voltage $V_{RET}$ is to be set to the same voltage as that of source voltage $V_{DD}$, as indicated by dotted line 76 in FIG. 4, a power line split off from the power line for source voltage $V_{DD}$ on the upstream side of power switch 74 may be used as the power line for source voltage $V_{RET}$.

Power supply controller part 70 receives mode control signal CNTR as a command from an external main controller (not shown) which controls the operations and the conditions of the entire equipment via a control input terminal or a pad on chip 72 and controls related respective parts according to the specific command. That is, when the instruction for normal mode is sent by the main controller, control signals RET and RETZ to the respective memory cells (FIG. 1) in memory cell array 50 are clamped to L level and H level, respectively, in the aforementioned manner so as to turn on latch surrounding switch circuits 20 and 24, to turn off float prevention transistor 42, and to turn on power switch 74 in order to supply source voltage $V_{DD}$ to the respective parts. In addition, when the instruction for standby mode is sent by the main controller, control signals RET and RETZ to the respective memory cells (FIG. 1) in memory cell array 50 are clamped to H level and L level, respectively, in the aforementioned manner so as to turn off latch surrounding switch circuits 20 and 24, to turn on float prevention transistor 42, and to turn off power switch 74 in order to shut off source voltage $V_{DD}$ to the respective parts. Furthermore, functional circuits 78 and 80 in FIG. 4 indicate arbitrary $V_{DD}$ system circuits mounted on said semiconductor chip 72.

Although only one memory cell array 50 is shown in FIG. 4, in practice, many memory cell arrays or static RAMs are often used on a single 1 semiconductor chip 72. Here, too, the same power control is carried out with respect to each $V_{RET}$ system circuit and $V_{DD}$ system circuit at the respective memory cell arrays or the static RAMs and other arbitrary logic circuits. According to the present invention, because the amount of power consumed by the standard MOS transistors constituting the $V_{DD}$ system circuit can be held down by shutting off the power while in standby mode, MOS fabrication processes for realizing a faster speed, even for those which cause increased leakage current, can be well adopted. On the other hand, in the case of a product mounted with the semiconductor chip of the present invention, not only can the performance be improved due to the faster speed of the $V_{DD}$ system circuit, but also the overall power consumption can be reduced while assuring the protection of the data stored in the case of the $V_{RET}$ system circuit by fully utilizing the standby mode.

Figure 5:
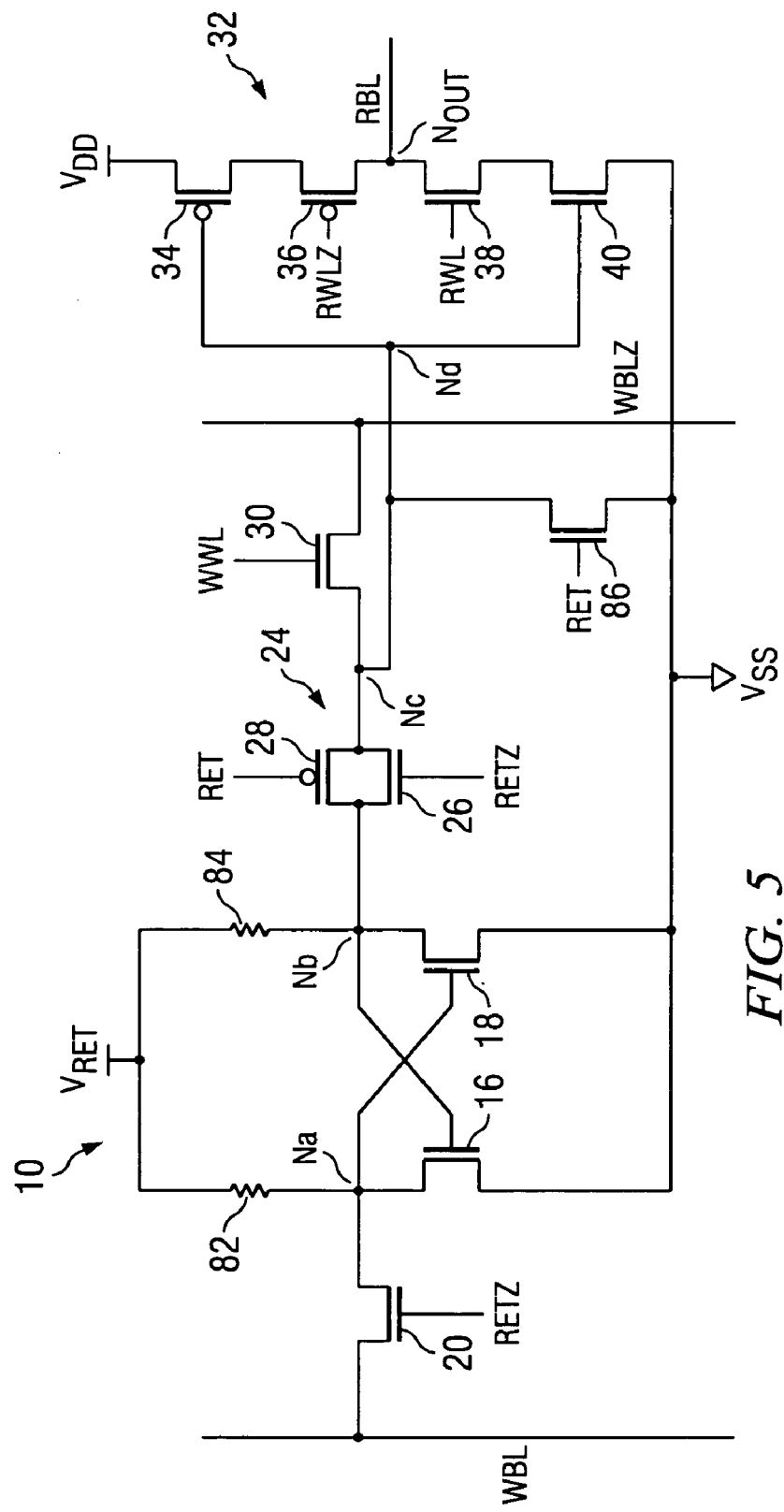
FIG. 5 is a circuit diagram showing a modification example of the memory cell in the embodiment.

A modification example of the memory cell of the aforementioned embodiment is shown in FIG. 5. It involves three major modifications. The first is that PMOS transistors 12 and 14 (FIG. 1) in latch circuit 10 are replaced with resistors 82 and 84. Although this used of resistors is disadvantageous compared with the use of MOS-elements utilizing PMOS transistors 12 and 14 in that the power consumption increases during standby, it is advantageous in that a higher integration level can be achieved. The second modification is that float prevention PMOS transistor 42 (FIG. 1) in output circuit 32 is replaced with NMOS transistor 86. In this case, NMOS transistor 86 is connected between the input terminal of output circuit 32 or node $N_d$ and the power supply terminal at ground potential $V_{SS}$, and control signal RET is supplied to its gate terminal from power supply controller part 70. NMOS transistor 86 is turned on to clamp node $N_d$ to ground potential $V_{SS}$ (L level) when switching from normal mode to standby mode. The third modification is that write transfer gate 22 provided independently of the output port is omitted, and NMOS transistor 20 of switch circuit 20 is configured also to serve the function of transfer gate 22. As described above, it is possible to configure the latch circuit surrounding switch circuit also to serve the function of the transfer gate. Furthermore, while transmission gate 24 exhibits excellent signal propagation with little voltage drop with respect to both L level and H level, transmission gate 24 may be replaced with a single MOS transistor, for example, an NMOS transistor, as required.

The present invention is not restricted to the asynchronous 2-port (1 write port and 1 read port) memory cells and the static RAMs in the aforementioned embodiments, but can be applied to an arbitrary semiconductor memory cell which is capable of latching data continuously as long as the source voltage is applied. Furthermore, it can also be applied to an arbitrary semiconductor memory device or a semiconductor device which contains this type of semiconductor memory cell.

In summary, the semiconductor device of the present invention has a latch circuit including at least one MOS transistor for latching one bit of data electrically in the form of voltage and a switch circuit including at least one MOS transistor for connecting and disconnecting the latch circuit to and from a circuit peripheral to the aforementioned latch circuit, wherein, a second source voltage is supplied to the aforementioned latch circuit independently of a first source voltage supplied to the aforementioned peripheral circuit, the aforementioned switch circuit is turned on and off sequentially with the turning on and off of the aforementioned first source voltage to the aforementioned peripheral circuit, and the MOS transistors included in the aforementioned latch circuit and the aforementioned switch circuit are configured using a low-leakage MOS transistor with a lower leakage current than that of the MOS transistor included in the aforementioned peripheral circuit.

In addition, the semiconductor device of the present invention has a latch circuit including a first and a second data storage nodes for latching one bit of data electrically in the form of two types of voltages with opposite logic levels and at least one MOS transistor, a peripheral circuit including at least one MOS transistor for exchanging data with the aforementioned latch circuit, a switch circuit including at least one MOS transistor for connecting and disconnecting the aforementioned latch circuit to and from the aforementioned peripheral circuit, a first source voltage supply part for supplying a first source voltage to the aforementioned peripheral circuit, a second source voltage supply part for supplying a second source voltage to the aforementioned latch circuit, a first controller part for controlling the turning on and off of the aforementioned first source voltage supply part independently of the aforementioned second source voltage supply part, and a second controller part for controlling the turning on and off of the aforementioned switch circuit sequentially with the turning on and off of the aforementioned first source voltage supply part, wherein the MOS transistors included in the aforementioned latch circuit and the aforementioned switch circuit are configured using a low-leakage MOS transistor with a lower leakage current than that of the MOS transistor included in the aforementioned peripheral circuit.

In addition, the semiconductor device of the present invention has a latch circuit including at least one MOS transistor for latching one bit of data electrically in the form of a voltage, a write circuit including at least one MOS transistor for writing data to the aforementioned latch circuit, a first switch circuit including at least one MOS transistor for connecting and disconnecting the aforementioned latch circuit to and from the aforementioned write circuit, a read circuit including at least one MOS transistor for reading data from the aforementioned latch circuit, a second switch circuit including at least one MOS transistor for connecting and disconnecting the aforementioned latch circuit to and from the aforementioned read circuit, a first source voltage supply part for supplying a first source voltage to the aforementioned write circuit and the aforementioned read circuit, a second source voltage supply part for supplying a second source voltage to the aforementioned latch circuit, a first controller part for controlling the turning on and off of the aforementioned first source voltage supply part independently of the aforementioned second source voltage supply part, and a second controller part for controlling the turning on and off of the aforementioned first and the second switch circuits sequentially with the turning on and off of the aforementioned first source voltage supply part, wherein the MOS transistors included in the aforementioned latch circuit and the aforementioned first and the second switch circuit are configured using a low-leakage MOS transistor with a lower leakage current than those of the MOS transistors included in the aforementioned write circuit and the aforementioned read circuit.

In the present invention, because independent source voltages are supplied to the latch circuit and the peripheral circuits (for example, a write circuit and a read circuit), the supply of the second source voltage to the latch circuit can be maintained by the second source voltage supply part even when the first source voltage supply part stops supplying the first source voltage to the peripheral circuit, so that the latch circuit can latch the stored data safely. Moreover, because the latch circuit is configured using the low-leakage MOS transistor, only a low standby current or a low operating current is needed to latch the data. Furthermore, because the switch circuit configured using the low-leakage MOS transistor is turned off to disconnect the latch circuit from the peripheral circuit while the first source voltage on the peripheral circuit side is turned off, current leakage from the latch circuit to the peripheral circuit can be completely prevented, so that further power consumption reduction can be realized.

In the present invention, it is desirable that the leakage current of the low-leakage MOS transistor is less than or equal to 1/10 of the leakage current of the MOS transistor included in the peripheral circuit.

In a suitable embodiment of the present invention, the latch circuit may have a first NMOS transistor with one terminal connected to the first data storage node, a second terminal connected to the source voltage terminal at the reference potential, and the control terminal connected to the second data storage node and a second NMOS transistor with one terminal connected to the aforementioned second data storage node, a second terminal connected to the aforementioned source voltage terminal at the reference potential, and the control terminal connected the aforementioned first data storage node. Furthermore, it is also desirable to configure the latch circuit using a first PMOS transistor with one terminal connected to the first data storage node, a second terminal connected to the source voltage terminal of the first source voltage supply part, and the control terminal connected to the second data storage node and a second PMOS transistor with one terminal connected to the second data storage node, a second terminal connected to the source voltage terminal of the first source voltage supply part, and a control terminal connected to the first data storage node. Here, the latch circuit may also be configured using a first resistor with one terminal connected to the first data storage node and a second terminal connected to the source voltage terminal of the first source voltage supply part and a second resistor with one terminal connected to the second data storage node and a second terminal connected to the source voltage terminal of the first source voltage supply part.

The semiconductor memory cell in a suitable embodiment of the present invention comprises a latch circuit including a first and a second data storage node for latching one bit of data electrically in the form of two types of voltage with opposite logic levels and at least one MOS transistor, a first switch circuit for connecting and disconnecting the aforementioned first data storage node to and from a first write bit line, a second switch circuit for connecting and disconnecting the aforementioned second data storage node to and from a second write bit line, and an output circuit including at least one MOS transistor for outputting a voltage read from the aforementioned latch circuit onto a read bit line, wherein the input terminal of the aforementioned output circuit is connected to the first or the second data storage node of the aforementioned latch circuit via the aforementioned first or the second switch circuit, a second source voltage is supplied to the aforementioned latch circuit independently of a first source voltage that is supplied to the aforementioned output circuit, the aforementioned first and the second switch circuits are turned on and off sequentially with the turning on and off of the aforementioned first source voltage to the aforementioned output circuit, and the MOS transistors included in the aforementioned latch circuit and the aforementioned first and the second switch circuits are configured using a low-leakage MOS transistor with a lower leakage current than that of the MOS transistor included in the aforementioned output circuit.

In said suitable embodiment of the semiconductor memory cell, the output circuit has a first PMOS transistor with one terminal connected to the read bit line and a second terminal connected to the source voltage terminal of the first source voltage supply part and a first NMOS transistor with one terminal connected to the read bit line and a second terminal connected to a source voltage terminal with a reference potential, wherein a voltage output from the first or the second data storage node via the first or the second switch circuit is input simultaneously into the respective control terminals of the first PMOS transistor and the first NMOS transistor. In this case, the output circuit may have a second PMOS transistor connected in series with the first PMOS transistor between the read bit line and the source voltage terminal of the first source voltage supply part while its control terminal is connected to a first read word line and a second NMOS transistor connected in series with the first NMOS transistor between the read bit line and the source voltage terminal with the reference potential while its control terminal is connected to a second read word line, wherein first and second read control signals with opposite logic levels are supplied to the respective control terminal of the second PMOS transistor and the control terminal of the second NMOS transistor via the first and the second read word lines.

In addition, in order to prevent the input of the output circuit from floating when the first source voltage to the output circuit is shut off, one terminal of a third PMOS transistor is connected to the respective control terminals of the first PMOS transistor and the first NMOS transistor, and a second terminal is connected to the source voltage terminal of the first source voltage supply part such that the third PMOS transistor is turned on and off sequentially with the turning on and off of the first source voltage. Alternatively, a third NMOS transistor with one terminal connected to the respective control terminals of the first PMOS transistor and the first NMOS transistor and the second terminal connected to the source voltage terminal with the reference potential can be provided such that the third NMOS transistor is turned on and off sequentially with the turning on and off of the first source voltage.

In a suitable embodiment, the first switch circuit may have a fourth low-leakage NMOS transistor with one terminal connected to the first write bit line and a second terminal connected to the first data storage node. Preferably, it has a fourth low-leakage PMOS transistor with one terminal connected to the first write bit line and a second terminal connected to the first data storage node.

In addition, the second switch circuit has a fifth low-leakage NMOS transistor with one terminal connected to the second write bit line and a second terminal connected to the second data storage node. Preferably, it has a fifth low-leakage PMOS transistor with one terminal connected to the second write bit line and a second terminal connected to the second data storage node.

In addition, in a suitable embodiment, a sixth NMOS transistor connected between the first write bit line and the first switch while its control terminal is connected to a first write word line and a seventh NMOS transistor connected between the second write bit line and the second switch while its control terminal is connected to a second write word line are provided, wherein first and second write signals with the same logic level are supplied to the control terminal of the sixth NMOS transistor and the control terminal of the seventh NMOS transistor via the first and the second write word lines, respectively.

What is claimed is:

1. A semiconductor device comprising:
    a latch circuit including at least one MOS transistor for latching one bit of data electrically in the form of a voltage;
    a peripheral circuit including at least one MOS transistor for exchanging data with said latch circuit;
    a switch circuit including at least one MOS transistor for connecting and disconnecting said latch circuit to and from said peripheral circuit;
    a first source voltage supply part for supplying a first source voltage to said peripheral circuit;
    a second source voltage supply part for supplying a second source voltage to the latch circuit;
    a first controller part for controlling the turning on and off of the first source voltage supply part independently of the second source voltage supply part; and
    a second controller part for controlling the turning on and off of the switch circuit sequentially with the turning on and off of the first source voltage supply part, wherein the MOS transistors included in the latch circuit and the switch circuit are configured using a low-leakage MOS transistor with a lower leakage current than that of the MOS transistor included in the peripheral circuit.

2. The semiconductor device of claim 1 in which the leakage current of the low-leakage MOS transistor is less than or equal to $1/10$ of the leakage of the MOS transistor included in the peripheral circuit.

3. A semiconductor device comprising:
    a latch circuit including at least one MOS transistor for latching one bit of data electrically in the form of a voltage;
    a write circuit including at least one MOS transistor for writing data to the latch circuit;
    a first switch circuit including at least one MOS transistor for connecting and disconnecting the latch circuit to and from the write circuit;
    a read circuit including at least one MOS transistor for reading data from the latch circuit;
    a second switch circuit including at least one MOS transistor for connecting and disconnecting the latch circuit to and from the read circuit;
    a first source voltage supply part for supplying a first source voltage to the write circuit and the read circuit;
    a second source voltage supply part for supplying a second source voltage to the latch circuit;
    a first controller part for controlling the turning on and off of the first source voltage supply part independently of the second source voltage supply part; and
    a second controller part for controlling the turning on and off of the first and the second switch circuits sequentially with the turning on and off of the first source voltage supply part, wherein the MOS transistors included in the latch circuit and the first and the second switch circuit are configured using a low-leakage MOS transistor with a lower leakage current than those of the MOS transistors included in the write circuit and the read circuit.

4. The semiconductor device of claim 3 in which the leakage current of the low-leakage MOS transistor is less than or equal to $1/10$ of the leakages of the MOS transistors included in the write circuit and the read circuit.

5. The semiconductor device of claim 3 in which the first and the second switch circuits share at least one MOS transistor.

6. A semiconductor device comprising a memory cell which comprises:
    a latch circuit including first and second data storage nodes for latching one bit of data electrically in the form of two types of voltages with opposite logic levels and at least one MOS transistor; and
    a switch circuit including at least one MOS transistor for connecting and disconnecting the latch circuit to and from a circuit peripheral to the latch circuit;

wherein a second source voltage is supplied to the latch circuit independently of a first source voltage that is supplied to the peripheral circuit;

wherein the switch circuit is turned on and off sequentially with the turning on and off of the first source voltage to the peripheral circuit, and wherein the MOS transistors included in the latch circuit and the switch circuit are configured using a low-leakage MOS transistor with a lower leakage current than that of the MOS transistor included in the peripheral circuit.

7. The semiconductor device of claim 6 in which the leakage current of the low-leakage MOS transistor is less than or equal to 1/10 of the leakage current of the MOS transistor included in the peripheral circuit.

8. The semiconductor device of claim 6 in which the latch circuit comprises a first low-leakage NMOS transistor with a first terminal connected to the first data storage node, a second terminal connected to a source voltage terminal with a reference potential, and a control terminal connected to the second data storage node and a second low-leakage NMOS transistor with a first terminal connected to the second data storage node, a second terminal connected to the source voltage terminal with the reference potential, and a control terminal connected to the first data storage node.

9. The semiconductor device of claim 8 in which the latch circuit comprises:
   a first low-leakage PMOS transistor with a first terminal connected to the first data storage node, a second terminal connected to the source voltage terminal of the first source voltage supply part, and a control terminal connected to the second data storage node; and
   a second low-leakage PMOS transistor with a first terminal connected to the second data storage node, a second terminal connected to the source voltage terminal of the first source voltage supply part, and a control terminal connected to the first data storage node.

10. The semiconductor device of claim 8 in which the latch circuit comprises:
    a first resistor with a first terminal connected to the first data storage node and a second terminal connected to the source voltage terminal of the first source voltage supply part; and
    a second resistor with a first terminal connected to the second data storage node and a second terminal connected to the source voltage terminal of the first source voltage supply part.

11. A semiconductor device comprising:
    a latch circuit including a first and a second data storage node for latching one bit of data electrically in the form of two types of voltages of opposite logic levels and at least one MOS transistor;
    a first switch circuit for connecting and disconnecting the first data storage node to and from a first write bit line;
    a second switch circuit for connecting and disconnecting the second data storage node to and from a second write bit line; and
    an output circuit including at least one MOS transistor for outputting a voltage read from the latch circuit onto a read bit line, wherein the input terminal of the output circuit is connected to the first or the second data storage node of the latch circuit via the first or the second switch circuit,
    wherein a second source voltage is supplied to the latch circuit independently of a first source voltage that is supplied to the output circuit,
    wherein the first and the second switch circuits are turned on and off sequentially with the turning on and off of the first source voltage to the output circuit, and
    wherein the MOS transistors included in the latch circuit and the first and second switch circuits are configured using a low-leakage MOS transistor with a lower leakage current than that of the MOS transistor included in the output circuit.

12. The semiconductor device of claim 10 in which the leakage current of the low-leakage MOS transistor is less than or equal to 1/10 of the leakage current of the MOS transistor included in the output circuit.

13. The semiconductor device of claim 11 in which the output circuit comprises:
    a first PMOS transistor with a first terminal connected to the read bit line and a second terminal connected to the source voltage terminal of the first source voltage supply part; and
    a first NMOS transistor with a first terminal connected to the read bit line and a second terminal connected to a source voltage terminal with a reference potential;
    wherein a voltage output from the first or the second data storage node via the first or the second switch circuit is input simultaneously into the respective control terminals of the first PMOS transistor and the first NMOS transistor.

14. The semiconductor device of claim 13 in which the output circuit comprises:
    a second PMOS transistor connected in series with the first PMOS transistor between the read bit line and the source voltage terminal of the first source voltage supply part while its control terminal is connected to a first read word line; and
    a second NMOS transistor connected in series with the first NMOS transistor between the read bit line and the source voltage terminal with the reference potential while its control terminal is connected to a second read word line;
    wherein first and second read control signals with opposite logic levels are supplied to the respective control terminal of the second PMOS transistor and the control terminal of the second NMOS transistor via the first and second read word lines.

15. The semiconductor device of claim 13 having a third PMOS transistor with a first terminal connected to the respective control terminals of the first PMOS transistor and the first NMOS transistor and a second terminal connected to the source voltage terminal of the first source voltage supply part, wherein the third PMOS transistor is turned on and off sequentially with the turning on and off of the first source voltage.

16. The semiconductor device of claim 13 having a third NMOS transistor with a first terminal connected to the respective control terminals of the first PMOS transistor and the first NMOS transistor and a second terminal connected to the source voltage terminal with the reference potential, wherein the third NMOS transistor is turned on and off sequentially with the turning on and off of the first source voltage.

17. The semiconductor device of claim 11 in which the first switch circuit has a fourth low-leakage NMOS transistor with a first terminal connected to the first write bit line and a second terminal connected to the first data storage node.

18. The semiconductor device of claim 17 in which the first switch circuit has a fourth low-leakage PMOS transistor with a first terminal connected to the first write bit line and a second terminal connected to the first data storage node.

19. The semiconductor device of claim 11 in which the second switch circuit has a fifth low-leakage NMOS transistor with a first terminal connected to the second write bit line and a second terminal connected to the second data storage node.

20. The semiconductor device of claim 19 in which the second switch circuit has a fifth low-leakage PMOS transistor with a first terminal connected to the second write bit line and a second terminal connected to the second data storage node.

21. The semiconductor device of claim 11 having a sixth NMOS transistor connected between the first write bit line and the first switch while its control terminal is connected to a first write word line and a seventh NMOS transistor connected between the second write bit line and the second switch while its control terminal is connected to a second write word line, wherein first and second write signals with the same logic level are supplied to the control terminal of the sixth NMOS transistor and the control terminal of the seventh NMOS transistor via the first and the second write word lines, respectively.

* * * * *